United States Patent [19]

Moon et al.

[11] Patent Number: 5,859,601
[45] Date of Patent: Jan. 12, 1999

[54] METHOD AND APPARATUS FOR IMPLEMENTING MAXIMUM TRANSITION RUN CODES

[75] Inventors: Jaekyun Moon, Plymouth; Barrett J. Brickner, Minneapolis, both of Minn.

[73] Assignee: Regents of the University of Minnesota, Minneapolis, Minn.

[21] Appl. No.: 730,716

[22] Filed: Oct. 15, 1996

Related U.S. Application Data

[60] Provisional application No. 60/014,954 Apr. 5, 1996.
[51] Int. Cl.⁶ .................................................. H03M 7/00
[52] U.S. Cl. ................................. 341/59; 341/94
[58] Field of Search ................................. 341/58, 59, 61, 341/94

[56] References Cited

U.S. PATENT DOCUMENTS

| | | | |
|---|---|---|---|
| 4,760,378 | 7/1988 | Iketani et al. | 340/347 DD |
| 4,775,985 | 10/1988 | Busby | 375/25 |
| 4,779,072 | 10/1988 | Van Gestel | 341/59 |
| 5,341,134 | 8/1994 | Benjauthrit | 341/58 |
| 5,450,443 | 9/1995 | Siegel et al. | 375/286 |
| 5,608,397 | 3/1997 | Soljanin | 341/58 |

*Primary Examiner*—Jeffrey A. Gaffin
*Assistant Examiner*—Jason L. W. Kost
*Attorney, Agent, or Firm*—Patterson & Keough

[57] ABSTRACT

Apparatus and method for coding to improve the minimum distance properties of sequence detectors operating at high densities in storage systems is presented. The coding scheme of the present invention is referred to as maximum transition run (MTR) code and eliminates data patterns producing long runs of consecutive transitions while imposing the usual k constraint necessary for timing recovery. The code has a distance gaining property similar to an existing (1,k) runlength-limited (RLL) code, but can be implemented with considerably higher code rates. When the MTR code is used with fixed delay tree search (FDTS) or high order partial response maximum likelihood (PRML) detectors, the bit error rate performance improves significantly over existing combinations of codes and detectors.

21 Claims, 14 Drawing Sheets

| RLL $k$ Constraint | Capacity with MTR $j = 2$ |
|---|---|
| ∞ | 0.8791 |
| 10 | 0.8782 |
| 9 | 0.8774 |
| 8 | 0.8760 |
| 7 | 0.8732 |
| 6 | 0.8680 |
| 5 | 0.8579 |
| 4 | 0.8376 |
| 3 | 0.7947 |

Fig. 5
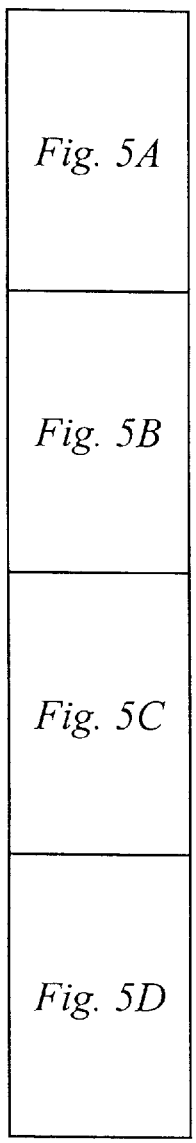
Fig. 5A
Fig. 5B
Fig. 5C
Fig. 5D
Fig. 6
DATAWORD • CODEWORD
0000 • 10000
0001 • 00001
0010 • 00010
0011 • 10001
0100 • 00100
0101 • 00101
0110 • 00110
0111 • 10110
1000 • 01000
1001 • 01001
1010 • 01010
1011 • 10010
1100 • 01100
1101 • 01101
1110 • 10100
1111 • 10101
Fig. 11
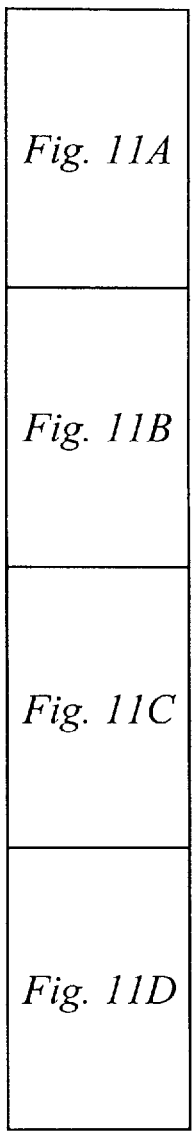
Fig. 11A
Fig. 11B
Fig. 11C
Fig. 11D

Fig. 5A

| n | k | m | rate | efficiency | codewords available | codewords required |
|---|---|---|------|------------|---------------------|--------------------|
| 4 | 4 | 2 | 0.5000 | 0.5969 | 6 | 4 |
| 4 | 5 | 2 | 0.5000 | 0.5828 | 7 | 4 |
| 4 | 6 | 3 | 0.7500 | 0.8640 | 8 | 8 |
| 5 | 4 | 3 | 0.6000 | 0.7163 | 12 | 8 |
| 5 | 5 | 3 | 0.6000 | 0.6994 | 13 | 8 |
| 5 | 6 | 3 | 0.6000 | 0.6912 | 14 | 8 |
| 5 | 7 | 3 | 0.6000 | 0.6871 | 15 | 8 |
| 5 | 8 | 4 | 0.8000 | 0.9133 | 16 | 16 |
| 6 | 4 | 4 | 0.6667 | 0.7959 | 20 | 16 |
| 6 | 5 | 4 | 0.6667 | 0.7771 | 23 | 16 |
| 6 | 6 | 4 | 0.6667 | 0.7680 | 26 | 16 |
| 6 | 7 | 4 | 0.6667 | 0.7634 | 27 | 16 |
| 6 | 8 | 4 | 0.6667 | 0.7611 | 28 | 16 |
| 6 | 9 | 4 | 0.6667 | 0.7598 | 29 | 16 |
| 6 | 10 | 4 | 0.6667 | 0.7591 | 30 | 16 |
| 7 | 4 | 5 | 0.7143 | 0.8527 | 36 | 32 |
| 7 | 5 | 5 | 0.7143 | 0.8326 | 41 | 32 |
| 7 | 6 | 5 | 0.7143 | 0.8229 | 46 | 32 |
| 7 | 7 | 5 | 0.7143 | 0.8180 | 49 | 32 |
| 7 | 8 | 5 | 0.7143 | 0.8154 | 52 | 32 |
| 7 | 9 | 5 | 0.7143 | 0.8141 | 53 | 32 |
| 7 | 10 | 5 | 0.7143 | 0.8133 | 54 | 32 |
| 8 | 4 | 6 | 0.7500 | 0.8954 | 66 | 64 |
| 8 | 5 | 6 | 0.7500 | 0.8742 | 75 | 64 |
| 8 | 6 | 6 | 0.7500 | 0.8640 | 84 | 64 |
| 8 | 7 | 6 | 0.7500 | 0.8589 | 89 | 64 |
| 8 | 8 | 6 | 0.7500 | 0.8562 | 94 | 64 |
| 8 | 9 | 6 | 0.7500 | 0.8548 | 97 | 64 |
| 8 | 10 | 6 | 0.7500 | 0.8540 | 100 | 64 |
| 9 | 4 | 6 | 0.6667 | 0.7959 | 116 | 64 |
| 9 | 5 | 7 | 0.7778 | 0.9066 | 137 | 128 |
| 9 | 6 | 7 | 0.7778 | 0.8960 | 154 | 128 |
| 9 | 7 | 7 | 0.7778 | 0.8907 | 163 | 128 |
| 9 | 8 | 7 | 0.7778 | 0.8879 | 172 | 128 |
| 9 | 9 | 7 | 0.7778 | 0.8864 | 177 | 128 |
| 9 | 10 | 7 | 0.7778 | 0.8856 | 182 | 128 |
| 10 | 4 | 7 | 0.7000 | 0.8357 | 208 | 128 |
| 10 | 5 | 7 | 0.7000 | 0.8159 | 247 | 128 |
| 10 | 6 | 8 | 0.8000 | 0.9216 | 282 | 256 |
| 10 | 7 | 8 | 0.8000 | 0.9161 | 299 | 256 |
| 10 | 8 | 8 | 0.8000 | 0.9133 | 316 | 256 |
| 10 | 9 | 8 | 0.8000 | 0.9117 | 325 | 256 |
| 10 | 10 | 8 | 0.8000 | 0.9109 | 334 | 256 |

Fig. 5B

| | | | | | | |
|---|---|---|---|---|---|---|
| 11 | 4 | 8 | 0.7273 | 0.8682 | 372 | 256 |
| 11 | 5 | 8 | 0.7273 | 0.8477 | 448 | 256 |
| 11 | 6 | 9 | 0.8182 | 0.9426 | 514 | 512 |
| 11 | 7 | 9 | 0.8182 | 0.9370 | 549 | 512 |
| 11 | 8 | 9 | 0.8182 | 0.9340 | 580 | 512 |
| 11 | 9 | 9 | 0.8182 | 0.9325 | 597 | 512 |
| 11 | 10 | 9 | 0.8182 | 0.9316 | 614 | 512 |
| 12 | 4 | 9 | 0.7500 | 0.8954 | 664 | 512 |
| 12 | 5 | 9 | 0.7500 | 0.8742 | 812 | 512 |
| 12 | 6 | 9 | 0.7500 | 0.8640 | 938 | 512 |
| 12 | 7 | 9 | 0.7500 | 0.8589 | 1005 | 512 |
| 12 | 8 | 10 | 0.8333 | 0.9513 | 1066 | 1024 |
| 12 | 9 | 10 | 0.8333 | 0.9497 | 1097 | 1024 |
| 12 | 10 | 10 | 0.8333 | 0.9489 | 1128 | 1024 |
| 13 | 4 | 10 | 0.7692 | 0.9183 | 1188 | 1024 |
| 13 | 5 | 10 | 0.7692 | 0.8966 | 1471 | 1024 |
| 13 | 6 | 10 | 0.7692 | 0.8862 | 1712 | 1024 |
| 13 | 7 | 10 | 0.7692 | 0.8809 | 1841 | 1024 |
| 13 | 8 | 10 | 0.7692 | 0.8781 | 1956 | 1024 |
| 13 | 9 | 10 | 0.7692 | 0.8767 | 2017 | 1024 |
| 13 | 10 | 11 | 0.8462 | 0.9635 | 2074 | 2048 |
| 14 | 4 | 11 | 0.7857 | 0.9380 | 2122 | 2048 |
| 14 | 5 | 11 | 0.7857 | 0.9159 | 2667 | 2048 |
| 14 | 6 | 11 | 0.7857 | 0.9052 | 3124 | 2048 |
| 14 | 7 | 11 | 0.7857 | 0.8998 | 3372 | 2048 |
| 14 | 8 | 11 | 0.7857 | 0.8970 | 3590 | 2048 |
| 14 | 9 | 11 | 0.7857 | 0.8955 | 3705 | 2048 |
| 14 | 10 | 11 | 0.7857 | 0.8947 | 3814 | 2048 |
| 15 | 4 | 11 | 0.7333 | 0.8755 | 3792 | 2048 |
| 15 | 5 | 12 | 0.8000 | 0.9325 | 4834 | 4096 |
| 15 | 6 | 12 | 0.8000 | 0.9216 | 5702 | 4096 |
| 15 | 7 | 12 | 0.8000 | 0.9161 | 6176 | 4096 |
| 15 | 8 | 12 | 0.8000 | 0.9133 | 6588 | 4096 |
| 15 | 9 | 12 | 0.8000 | 0.9117 | 6807 | 4096 |
| 15 | 10 | 12 | 0.8000 | 0.9109 | 7010 | 4096 |
| 16 | 4 | 12 | 0.7500 | 0.8954 | 6778 | 4096 |
| 16 | 5 | 13 | 0.8125 | 0.9471 | 8760 | 8192 |
| 16 | 6 | 13 | 0.8125 | 0.9360 | 10408 | 8192 |
| 16 | 7 | 13 | 0.8125 | 0.9305 | 11313 | 8192 |
| 16 | 8 | 13 | 0.8125 | 0.9275 | 12090 | 8192 |
| 16 | 9 | 13 | 0.8125 | 0.9260 | 12505 | 8192 |
| 16 | 10 | 13 | 0.8125 | 0.9252 | 12886 | 8192 |
| 17 | 4 | 13 | 0.7647 | 0.9129 | 12112 | 8192 |
| 17 | 5 | 13 | 0.7647 | 0.8914 | 15877 | 8192 |
| 17 | 6 | 14 | 0.8235 | 0.9487 | 18996 | 16384 |

Fig. 5C

| | | | | | | |
|---|---|---|---|---|---|---|
| 17 | 7 | 14 | 0.8235 | 0.9431 | 20723 | 16384 |
| 17 | 8 | 14 | 0.8235 | 0.9401 | 22188 | 16384 |
| 17 | 9 | 14 | 0.8235 | 0.9386 | 22972 | 16384 |
| 17 | 10 | 14 | 0.8235 | 0.9377 | 23686 | 16384 |
| 18 | 4 | 14 | 0.7778 | 0.9285 | 21646 | 16384 |
| 18 | 5 | 14 | 0.7778 | 0.9066 | 28776 | 16384 |
| 18 | 6 | 15 | 0.8333 | 0.9600 | 34670 | 32768 |
| 18 | 7 | 15 | 0.8333 | 0.9543 | 37960 | 32768 |
| 18 | 8 | 15 | 0.8333 | 0.9513 | 40720 | 32768 |
| 18 | 9 | 15 | 0.8333 | 0.9497 | 42202 | 32768 |
| 18 | 10 | 15 | 0.8333 | 0.9489 | 43536 | 32768 |
| 19 | 4 | 15 | 0.7895 | 0.9425 | 38684 | 32768 |
| 19 | 5 | 15 | 0.7895 | 0.9202 | 52153 | 32768 |
| 19 | 6 | 15 | 0.7895 | 0.9095 | 63278 | 32768 |
| 19 | 7 | 16 | 0.8421 | 0.9644 | 69534 | 65536 |
| 19 | 8 | 16 | 0.8421 | 0.9613 | 74732 | 65536 |
| 19 | 9 | 16 | 0.8421 | 0.9597 | 77529 | 65536 |
| 19 | 10 | 16 | 0.8421 | 0.9589 | 80024 | 65536 |
| 20 | 4 | 16 | 0.8000 | 0.9551 | 69132 | 65536 |
| 20 | 5 | 16 | 0.8000 | 0.9325 | 94523 | 65536 |
| 20 | 6 | 16 | 0.8000 | 0.9216 | 115492 | 65536 |
| 20 | 7 | 16 | 0.8000 | 0.9161 | 127369 | 65536 |
| 20 | 8 | 17 | 0.8500 | 0.9703 | 137152 | 131072 |
| 20 | 9 | 17 | 0.8500 | 0.9687 | 142429 | 131072 |
| 20 | 10 | 17 | 0.8500 | 0.9679 | 147092 | 131072 |
| 21 | 4 | 16 | 0.7619 | 0.9096 | 123548 | 65536 |
| 21 | 5 | 17 | 0.8095 | 0.9436 | 171314 | 131072 |
| 21 | 6 | 17 | 0.8095 | 0.9326 | 210790 | 131072 |
| 21 | 7 | 17 | 0.8095 | 0.9270 | 233309 | 131072 |
| 21 | 8 | 17 | 0.8095 | 0.9241 | 251708 | 131072 |
| 21 | 9 | 17 | 0.8095 | 0.9226 | 261658 | 131072 |
| 21 | 10 | 18 | 0.8571 | 0.9760 | 270370 | 262144 |
| 22 | 4 | 17 | 0.7727 | 0.9225 | 220794 | 131072 |
| 22 | 5 | 18 | 0.8182 | 0.9537 | 310489 | 262144 |
| 22 | 6 | 18 | 0.8182 | 0.9426 | 384724 | 262144 |
| 22 | 7 | 18 | 0.8182 | 0.9370 | 427366 | 262144 |
| 22 | 8 | 18 | 0.8182 | 0.9340 | 461946 | 262144 |
| 22 | 9 | 18 | 0.8182 | 0.9325 | 480694 | 262144 |
| 22 | 10 | 18 | 0.8182 | 0.9316 | 496970 | 262144 |
| 23 | 4 | 18 | 0.7826 | 0.9343 | 394584 | 262144 |
| 23 | 5 | 19 | 0.8261 | 0.9629 | 562732 | 524288 |
| 23 | 6 | 19 | 0.8261 | 0.9517 | 702180 | 524288 |
| 23 | 7 | 19 | 0.8261 | 0.9460 | 782831 | 524288 |
| 23 | 8 | 19 | 0.8261 | 0.9431 | 847784 | 524288 |
| 23 | 9 | 19 | 0.8261 | 0.9415 | 883087 | 524288 |
| 23 | 10 | 19 | 0.8261 | 0.9406 | 913484 | 524288 |

Fig. 5D

| | | | | | | |
|---|---|---|---|---|---|---|
| 24 | 4 | 19 | 0.7917 | 0.9451 | 705168 | 524288 |
| 24 | 5 | 19 | 0.7917 | 0.9228 | 1019898 | 524288 |
| 24 | 6 | 20 | 0.8333 | 0.9600 | 1281584 | 1048576 |
| 24 | 7 | 20 | 0.8333 | 0.9543 | 1433958 | 1048576 |
| 24 | 8 | 20 | 0.8333 | 0.9513 | 1555892 | 1048576 |
| 24 | 9 | 20 | 0.8333 | 0.9497 | 1622325 | 1048576 |
| 24 | 10 | 20 | 0.8333 | 0.9489 | 1679082 | 1048576 |
| 25 | 4 | 20 | 0.8000 | 0.9551 | 1260216 | 1048576 |
| 25 | 5 | 20 | 0.8000 | 0.9325 | 1848466 | 1048576 |
| 25 | 6 | 21 | 0.8400 | 0.9677 | 2339084 | 2097152 |
| 25 | 7 | 21 | 0.8400 | 0.9619 | 2626666 | 2097152 |
| 25 | 8 | 21 | 0.8400 | 0.9589 | 2855444 | 2097152 |
| 25 | 9 | 21 | 0.8400 | 0.9573 | 2980384 | 2097152 |
| 25 | 10 | 21 | 0.8400 | 0.9565 | 3086334 | 2097152 |
| 26 | 4 | 21 | 0.8077 | 0.9643 | 2252152 | 2097152 |
| 26 | 5 | 21 | 0.8077 | 0.9415 | 3350167 | 2097152 |
| 26 | 6 | 22 | 0.8462 | 0.9748 | 4269182 | 4194304 |
| 26 | 7 | 22 | 0.8462 | 0.9690 | 4811419 | 4194304 |
| 26 | 8 | 22 | 0.8462 | 0.9660 | 5240442 | 4194304 |
| 26 | 9 | 22 | 0.8462 | 0.9643 | 5475284 | 4194304 |
| 26 | 10 | 22 | 0.8462 | 0.9635 | 5673012 | 4194304 |
| 27 | 4 | 21 | 0.7778 | 0.9285 | 4024856 | 2097152 |
| 27 | 5 | 22 | 0.8148 | 0.9498 | 6071855 | 4194304 |
| 27 | 6 | 22 | 0.8148 | 0.9387 | 7791902 | 4194304 |
| 27 | 7 | 23 | 0.8519 | 0.9755 | 8813360 | 8388608 |
| 27 | 8 | 23 | 0.8519 | 0.9725 | 9617500 | 8388608 |
| 27 | 9 | 23 | 0.8519 | 0.9708 | 10058681 | 8388608 |
| 27 | 10 | 23 | 0.8519 | 0.9700 | 10427604 | 8388608 |
| 28 | 4 | 22 | 0.7857 | 0.9380 | 7192882 | 4194304 |
| 28 | 5 | 23 | 0.8214 | 0.9575 | 11004651 | 8388608 |
| 28 | 6 | 23 | 0.8214 | 0.9463 | 14221398 | 8388608 |
| 28 | 7 | 23 | 0.8214 | 0.9407 | 16143951 | 8388608 |
| 28 | 8 | 24 | 0.8571 | 0.9785 | 17650478 | 16777216 |
| 28 | 9 | 24 | 0.8571 | 0.9769 | 18478872 | 16777216 |
| 28 | 10 | 24 | 0.8571 | 0.9760 | 19167054 | 16777216 |

Fig. 10

| C = 0 | | | | C = 2 | | | C = 4 | | C = 6 |
|---|---|---|---|---|---|---|---|---|---|
| 219 | 795 | 3171 | 3651 | 247 | 998 | 3553 | 503 | 3555 | 1015 |
| 222 | 798 | 3174 | 3654 | 251 | 1004 | 3556 | 507 | 3558 | 3319 |
| 231 | 807 | 3180 | 3657 | 439 | 1009 | 3611 | 887 | 3564 | 3323 |
| 238 | 819 | 3185 | 3660 | 443 | 3127 | 3614 | 891 | 3569 | 3511 |
| 243 | 822 | 3192 | 3681 | 446 | 3131 | 3623 | 894 | 3576 | 3515 |
| 246 | 825 | 3207 | 3684 | 475 | 3134 | 3635 | 951 | 3639 | 3518 |
| 249 | 828 | 3214 | 3777 | 478 | 3175 | 3638 | 955 | 3643 | 3547 |
| 252 | 867 | 3219 | 3780 | 487 | 3182 | 3641 | 958 | 3646 | 3550 |
| 311 | 870 | 3225 | 3784 | 494 | 3187 | 3644 | 987 | 3687 | 3559 |
| 315 | 876 | 3228 | 3843 | 499 | 3190 | 3655 | 990 | 3694 | 3566 |
| 318 | 881 | 3267 | 3846 | 502 | 3193 | 3662 | 999 | 3699 | 3571 |
| 411 | 888 | 3270 | 3849 | 505 | 3196 | 3683 | 1006 | 3702 | 3574 |
| 414 | 903 | 3273 | 3852 | 631 | 3227 | 3686 | 1011 | 3705 | 3577 |
| 435 | 910 | 3276 | 3857 | 635 | 3230 | 3692 | 1014 | 3708 | 3703 |
| 438 | 915 | 3288 | 3864 | 638 | 3271 | 3697 | 3191 | 3783 | 3707 |
| 441 | 921 | 3297 | 3873 | 823 | 3278 | 3704 | 3195 | 3790 | 3710 |
| 444 | 924 | 3300 | 3876 | 827 | 3289 | 3779 | 3198 | 3801 | 3803 |
| 455 | 945 | 3459 | | 830 | 3292 | 3782 | 3291 | 3804 | 3806 |
| 462 | 952 | 3462 | | 871 | 3299 | 3785 | 3294 | 3811 | 3815 |
| 473 | 963 | 3465 | | 878 | 3302 | 3788 | 3303 | 3814 | 3822 |
| 476 | 966 | 3468 | | 883 | 3308 | 3800 | 3310 | 3820 | 3827 |
| 483 | 969 | 3473 | | 886 | 3313 | 3809 | 3315 | 3825 | 3830 |
| 486 | 972 | 3480 | | 889 | 3320 | 3812 | 3318 | 3832 | 3833 |
| 492 | 984 | 3521 | | 892 | 3463 | 3847 | 3321 | 3867 | 3836 |
| 497 | 993 | 3524 | | 923 | 3470 | 3854 | 3324 | 3870 | 3895 |
| 504 | 996 | 3528 | | 926 | 3475 | 3859 | 3483 | 3879 | 3899 |
| 567 | 3099 | 3591 | | 947 | 3481 | 3865 | 3486 | 3891 | 3902 |
| 571 | 3102 | 3598 | | 950 | 3484 | 3868 | 3507 | 3894 | 3943 |
| 574 | 3111 | 3603 | | 953 | 3505 | 3875 | 3510 | 3897 | 3950 |
| 615 | 3123 | 3609 | | 956 | 3512 | 3878 | 3513 | 3900 | 3955 |
| 622 | 3126 | 3612 | | 967 | 3523 | 3889 | 3516 | 3939 | 3958 |
| 627 | 3129 | 3619 | | 974 | 3526 | 3896 | 3527 | 3942 | 3961 |
| 630 | 3132 | 3622 | | 985 | 3529 | 3937 | 3534 | 3948 | 3964 |
| 633 | 3143 | 3633 | | 988 | 3532 | 3940 | 3545 | 3953 | |
| 636 | 3150 | 3640 | | 995 | 3544 | | 3548 | 3960 | |

Fig. 11A

|  n | k | m | rate | Max C | codewords available | codewords required |
|---|---|---|---|---|---|---|
|  6 |  4 |  2 | 0.3333 | 2 |    5 |    4 |
|  7 |  4 |  3 | 0.4286 | 3 |    9 |    8 |
|  7 |  5 |  3 | 0.4286 | 3 |   10 |    8 |
|  8 |  4 |  4 | 0.5000 | 2 |   19 |   16 |
|  8 |  5 |  4 | 0.5000 | 2 |   24 |   16 |
|  8 |  6 |  5 | 0.6250 | 6 |   32 |   32 |
|  9 |  4 |  4 | 0.4444 | 3 |   24 |   16 |
|  9 |  5 |  5 | 0.5556 | 3 |   33 |   32 |
|  9 |  6 |  5 | 0.5556 | 3 |   39 |   32 |
|  9 |  7 |  5 | 0.5556 | 3 |   42 |   32 |
| 10 |  4 |  5 | 0.5000 | 2 |   47 |   32 |
| 10 |  5 |  6 | 0.6000 | 4 |   79 |   64 |
| 10 |  6 |  6 | 0.6000 | 2 |   75 |   64 |
| 10 |  7 |  6 | 0.6000 | 2 |   82 |   64 |
| 10 |  8 |  6 | 0.6000 | 2 |   84 |   64 |
| 11 |  4 |  6 | 0.5455 | 3 |   70 |   64 |
| 11 |  5 |  6 | 0.5455 | 3 |   97 |   64 |
| 11 |  6 |  7 | 0.6364 | 5 |  144 |  128 |
| 11 |  7 |  7 | 0.6364 | 3 |  129 |  128 |
| 11 |  8 |  7 | 0.6364 | 3 |  137 |  128 |
| 11 |  9 |  7 | 0.6364 | 3 |  142 |  128 |
| 12 |  4 |  7 | 0.5833 | 2 |  135 |  128 |
| 12 |  5 |  8 | 0.6667 | 6 |  263 |  256 |
| 12 |  6 |  8 | 0.6667 | 4 |  296 |  256 |
| 12 |  7 |  8 | 0.6667 | 4 |  328 |  256 |
| 12 |  8 |  8 | 0.6667 | 2 |  264 |  256 |
| 12 |  9 |  8 | 0.6667 | 2 |  274 |  256 |
| 12 | 10 |  8 | 0.6667 | 2 |  277 |  256 |
| 13 |  4 |  7 | 0.5385 | 3 |  200 |  128 |
| 13 |  5 |  8 | 0.6154 | 3 |  296 |  256 |
| 13 |  6 |  8 | 0.6154 | 3 |  364 |  256 |
| 13 |  7 |  9 | 0.6923 | 5 |  514 |  512 |
| 13 |  8 |  9 | 0.6923 | 5 |  556 |  512 |
| 13 |  9 |  9 | 0.6923 | 5 |  583 |  512 |
| 13 | 10 |  9 | 0.6923 | 5 |  601 |  512 |
| 14 |  4 |  9 | 0.6429 | 6 |  524 |  512 |
| 14 |  5 |  9 | 0.6429 | 2 |  562 |  512 |
| 14 |  6 | 10 | 0.7143 | 6 | 1046 | 1024 |
| 14 |  7 | 10 | 0.7143 | 4 | 1038 | 1024 |
| 14 |  8 | 10 | 0.7143 | 4 | 1114 | 1024 |

| | | | | | | |
|---|---|---|---|---|---|---|
| 27 | 9 | 21 | 0.7778 | 5 | 2260957 | 2097152 |
| 27 | 10 | 21 | 0.7778 | 5 | 2361027 | 2097152 |
| 28 | 4 | 20 | 0.7143 | 8 | 1085033 | 1048576 |
| 28 | 5 | 21 | 0.7500 | 6 | 2327099 | 2097152 |
| 28 | 6 | 22 | 0.7857 | 12 | 4234345 | 4194304 |
| 28 | 7 | 22 | 0.7857 | 6 | 4398507 | 4194304 |
| 28 | 8 | 22 | 0.7857 | 6 | 4985834 | 4194304 |
| 28 | 9 | 22 | 0.7857 | 4 | 4339268 | 4194304 |
| 28 | 10 | 22 | 0.7857 | 4 | 4525346 | 4194304 |

METHOD AND APPARATUS FOR IMPLEMENTING MAXIMUM TRANSITION RUN CODES

This application claims the benefit of U.S. provisional application No. 60/014,954, filed Apr. 5, 1996.

FIELD OF THE INVENTION

The present invention relates in general to digital storage systems. More specifically, the invention pertains to an improved coding technique involving data recovery channels utilizing sequence detection methods.

BACKGROUND OF THE INVENTION

Channel codes, sometimes called modulation codes, are mappings of data bits into the symbols that are either transmitted in a communication system or recorded onto a medium in a storage device. The purpose of these codes is to prevent certain characteristics in the stream of symbols that make their recovery difficult. Runlength limited (RLL) codes are commonly used in magnetic recording. These codes impose a (d,k) constraint on the recorded data sequence. With the Non-Return-to-Zero (NRZ) recording format, where the binary "1" represents a positive level in the magnetization waveform and the binary "0" negative level in the same waveform, d+1 is the minimum number of consecutive like symbols and k+1 is the maximum number of consecutive like symbols in the binary sequence. With the Non-Return-to-Zero-Inversion (NRZI) recording format, where a magnetic transition is represented by 1 and no transition by 0, d and k are the minimum and maximum number of consecutive 0's between any two 1's, respectively as described in P. H. Siegel, "Recording codes for digital magnetic storage," *IEEE Transactions on Magnetics*, vol. MAG-21, no. 5, pp. 1344–1349, September 1985. The d constraint is used to increase the minimum physical spacing between transitions. The k constraint guarantees that a change in the readback waveform will occur at regular intervals for the purpose of synchronizing a phase locked loop to the data. A (1,7) code is a common example of an RLL code; see U.S. Pat. No. 4,337,458. Also popular is the (0,4/4) code, where d=0 and k=4 both for the data sequence and for the sequence that results if every other symbol is considered; see U.S. Pat. No. 4,707,681. Additional constraints, such as a limitation on the total number of NRZI 1's in a codeword for the purpose of improving timing and gain control can be applied to these codes; see U.S. Pat. No. 5,196,849. A DC-free constraint as described in U.S. Pat. No. 4,499,454 can be used to reduce the low frequency spectral content of the readback signal. Codes for data storage typically assume a binary symbol set such as the polarity of the write signal or the presence and absence of a transition, but it is possible to conceive systems that use more than two distinct symbols. For example, the ternary 3PM code uses three distinct symbols and places a lower bound on the distance between symbols in the same way that the RLL d constraint is applied to the binary case. See G. V. Jacoby, "Ternary 3PM magnetic recording code and system," *IEEE Transactions on Magnetics*, vol. MAG-17, no. 6, pp. 3326–3328, November 1981. In optical data storage, a special type of RLL constraint is applied to guarantee the minimum size of the written mark on the medium as described in R. Karabed and P. H. Siegel, "Even mark modulation for optical recording," International Conference on Communications, June 1989. While RLL (1,k) coding has many useful properties, the required code rate, given by the number of data bits per channel bit, is typically low, forcing the channel to operate at a considerably higher speed than the actual data rate. On the other hand, (0,4/4) or more generally (0,G/I) coding offers a much higher rate, but does not provide any coding gain. Also, (0,G/I) codes are designed specifically for interleaved systems such as class IV partial response (PR4) systems, and are not optimal for other detectors such as fixed-delay tree search (FDTS) systems.

Sequence detectors are data recovery devices that examine multiple received samples to recover the input data sequence. Methods such as Viterbi detection, FDTS/DF, and PRML are all sequence detectors. In magnetic data storage devices, the response of the channel to an input symbol typically extends over several sample periods. Sequence detectors can outperform sample-by-sample decision rules such as peak detection by using information about the data to be detected contained in adjacent samples. Errors in sequence detectors arise mostly from difficulty in distinguishing minimum distance patterns. For a sequence detector that uses M samples to make a decision, all possible noiseless sample sequences can be plotted as points in an M-dimensional space, where each sample corresponds to a coordinate in this space. The minimum distance patterns are those patterns corresponding to different decisions that have the minimum Euclidean distance from one another. The Euclidean distance is the geometric distance between two points and refers to the square root of the sum of the squares of the differences between the coordinates of two points. The performance of sequence detectors such as $E^2PRML$ can be improved by coding to remove the patterns that cause minimum distance error events, thereby increasing the minimum distance. This increase in the minimum distance as a result of coding is termed coding gain. See R. Karabed and P. H. Siegel, "Coding for higher order partial response channels," *Proceedings of the International Society for Optical Engineering*, vol. 2605, pp. 115–126, 1995.

SUMMARY OF THE INVENTION

The present invention relates to a channel coding technique to improve data storage devices such as magnetic computer disk drives and professional and consumer tape recorders. The coding scheme, which is referred to herein as the maximum transition-run (MTR) coding, eliminates certain error-prone binary data patterns from the allowable set of input data patterns that are to be recorded in the storage medium. As a consequence, the final bit error rate is improved significantly when the original data bits are reproduced. This improvement in the bit error rate can be traded for an increase in storage density if the error rate performance is already satisfactory. See B. Brickner and J. Moon, "Coding for increased distance with a d=0 FDTS/DF detector," Seagate Internal Report, May 1995; also presented at the Annual Meeting of the National Storage Industry Consortium, Monterey, Calif., June 1995, and J. Moon and B. Brickner, "Maximum transition run codes for data storage systems," presented at Intermag '96, Seattle, Washington, April 1996.

More specifically, the MTR code imposes a limit on the maximum number of consecutive transitions that can occur in the written magnetization pattern in magnetic recording. Analysis indicates that the performance improvement is most significant for the bit densities anticipated for products in the near future when the maximum number of consecutive transitions is limited to two. The MTR code with a constraint length of j=2 will allow "dibit" transitions in the magnetization pattern, but will not permit "tribit" or longer runs of consecutive transitions. Unless indicated otherwise, our discussion of the MTR code relating to the present invention will be focused on the constraint of j=2 hereafter. When the MTR coding scheme is combined with a certain class of sequence detectors to recover written data in high density recording, the bit-error-rate (BER) performance is improved significantly over existing code/detector combinations such as (0,G/I) code/partial response maximum likelihood (PRML) and (1,7) RLL code/peak detector combinations. Computer implemented simulations show a large performance advantage with the MTR code combined with high order PRML systems and fixed delay tree search with decision feedback (FDTS/DF) systems over the existing code/detector combinations. With the NRZI format, the MTR code constraint is equivalent to limiting the maximum runlength of 1's. To facilitate timing recovery, the usual maximum runlength constraint is also imposed on 0's.

BRIEF DESCRIPTION OF THE DRAWINGS

FIG. 5 is a table showing the code parameters for MTR j=2 block codes with different RLL k constraints and different block sizes.

FIG. 6 shows a mapping of datawords to codewords for the rate 4/5 MTR (2;8) code.

FIG. 10 lists a decimal representation of the valid codewords corresponding to different values of C for the 8/12 DC-free MTR j=2 code.

FIG. 11 lists code parameters for DC-free MTR j=2 block codes with different RLL k constraints and different block sizes.

DESCRIPTION OF THE PREFERRED EMBODIMENT

The present invention pertains to an improved coding technique to enhance the minimum distance properties of sequence detectors. The invention is advantageously used in storage and similar systems operating at high data densities.

Figure 1:
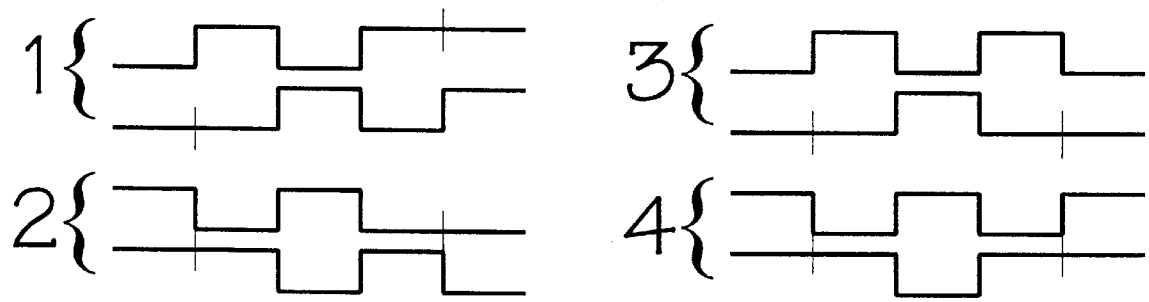
FIG. 1 shows pairs of write patterns causing most errors in sequence detection at high user densities.

Prior art experience indicates that the primary source of errors in optimal and near-optimal sequence detectors operating at high data densities is the detector's inability in the presence of noise to distinguish the minimum distance patterns. FIG. 1 is an exemplary depiction of pairs of write patterns which cause most errors in sequence detection. These four pairs correspond to an NRZ input error (or difference) pattern of $e_k = \pm\{2\text{-}2\ 2\}$, assuming input data take on +1's and −1's.

The present state of the art approach to attenuate these errors is to remove data patterns allowing this type of error pattern through coding. The potential improvement in the FDTS detection performance using this approach can be estimated by computing the increase in the minimum distance between two diverging look ahead tree paths after removing the paths that allow the $\pm\{2\text{-}2\ 2\}$ error events. A simple minimum distance analysis for PRML systems reveals that this is also a critical error pattern in high order PRML systems such as $E^2PR4ML$. Low order PRML systems are not dominated by these errors because they force the channel to respond like a low density system where the minimum distance error event is different.

To obtain a coding gain (improvement in minimum distance due to coding), the minimum distance pairs shown in FIG. 1 must be eliminated. In accordance with the present invention, this can be accomplished using the existing RLL (1,k) code, which does not allow consecutive transitions. The minimum requirement for producing a coding gain in this situation is to remove one pattern from each pair of minimum distance sequences. RLL (1,k) codes eliminate both patterns associated with all the minimum distance pairs and thereby result in fewer patterns available to the encoder. Consequently this imposes the need to map input data to a small set of patterns resulting in a lower code rate (the ratio of the number of input bits to output bits). Further, this increases the speed and bandwidth at which the detector must operate to produce data bits at a particular speed. An increase in noise bandwidth translates to increased noise in the system, which works against the coding gain. The idea of MTR coding is to eliminate all sequences with three or more consecutive transitions, but allow the dibit pattern to survive in the recorded sequence. Thus, with MTR coding, the dominant error events will be prevented as with (1,k) coding, but the required code rate is much better than that of the typical (1,k) RLL code.

Figure 2:
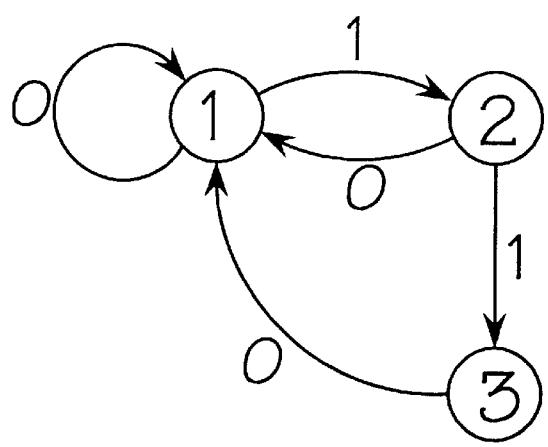
FIG. 2 is the state diagram for the MTR code with j=2.

Referring now to FIG. 2, the MTR j=2 code based on the NRZI recording convention, where 1 and 0 represent the presence and absence, respectively, of a magnetic transition is shown. Specifically, FIG. 2 depicts a state diagram defining all possible channel input sequences. For example, a sequence can be found by starting at any state and moving along the arrows. In the alternate, a sequence can also be found by taking each arrow label as the channel input. The capacity of the code can be obtained by finding the largest eigenvalue of the adjacency matrix A, which describes the transitions between states for the given state diagram and computing:

$$\text{Capacity} = \log_2 \lambda_{max}(A). \tag{1}$$

Figures 3, 4:
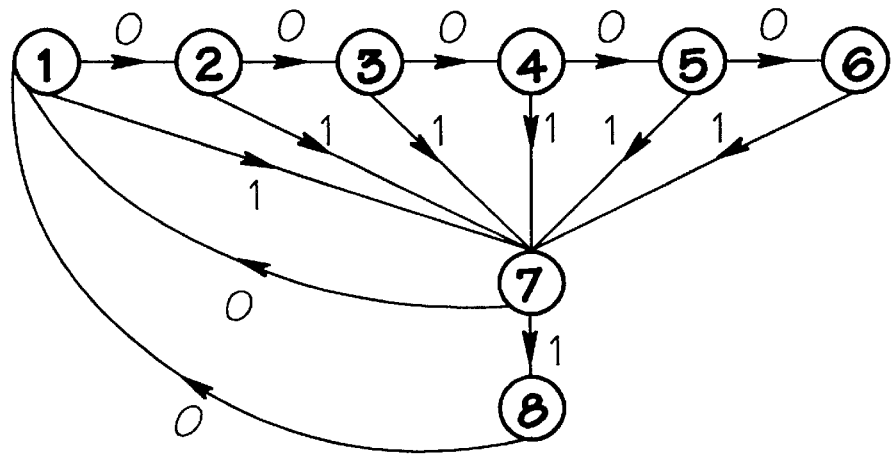
FIG. 3 is the state diagram for an MTR (2;6) code.
FIG. 4 gives the capacities for the MTR j=2 codes with different RLL k constraints.

To more compactly describe the code constraints, the MTR parameters are written as (j;k) where j is the MTR constraint and k is the usual RLL constraint. For practical codes, the RLL k-constraint must be included for timing recovery. This constraint can be incorporated into the state diagram as in the case of the MTR(j;k)=(2;6) code shown in FIG. 3. The capacities for MTR(2;k) codes for different k constraints are given in FIG. 4. The capacity is the upper bound on the code rate for the given set of parameters. Most codes will have a rate less than capacity because typically the code complexity will become very large as the code rate approaches capacity. For example, a code with a rate of 7/8 is possible for k≧8; however, it is likely to be extremely complex. Lower rates such as 4/5, 5/6 and 6/7 will require less complexity, while still improving on the 2/3 rate of RLL(1,7) codes.

While state-dependent encoders and sliding block decoders can be designed for the MTR constraint, simple fixed-length block codes can be realized with good rates and reasonable k values. A computer search is utilized to find the $2^m$ n-bit codewords required to implement a rate m/n block code. First, all binary words that contain the NRZI string of "111" or more than k consecutive NRZI 0's are removed from the list of $2^n$ n-bit binary words. Then, in order to meet the MTR constraint at the codeword boundaries, words that start or end with a "11" string are removed. Also, the k constraint is satisfied at the boundary by removing the words with $k_1+1$ leading 0's or $k_2+1$ trailing 0's where $k_1+k_2=k$. FIG. 5 shows code parameters for representative block codes obtained through computer search for various combinations of n and k. The efficiency is defined as the ratio of the code rate, m/n, to the capacity computed for the given value of k and the MTR constraint. Thus, the efficiency is a measure of how close the rate is to the upper bound.

As an example of a MTR block code, the rate 4/5, MTR(2;8) block code is given in FIG. 6. The pairing of user data blocks and codewords were chosen so that the second bit in the codeword corresponds to the second bit in the user data. Many other pairings are possible; the one chosen is reasonable, but not necessarily optimal in terms of minimizing the logic implementation. Note that the k=8 constraint comes into effect when the codewords 10000 00001 occur in sequence. If the user data and codeword pairs are represented by $$X = [X_0 X_1 X_2 X_3] \leftarrow \rightarrow Y = [Y_0 Y_1 Y_2 Y_3 Y_4]. \qquad (2)$$

then the equations for the encoder are:

$$M = \bar{X}_0 + \bar{X}_1$$

$$Y_0 = \bar{X}_1 \bar{Y}_1 \bar{Y}_3 \bar{Y}_4 + X_2 \bar{Y}_3 X_2 X_3$$

$$Y_1 = X_0 \bar{X}_1 X_3 + X_0 \bar{X}_2 \qquad (3)$$

$$Y_2 = X_1$$

$$Y_3 = X_2 \bar{Y}_4 M$$

$$Y_4 = \bar{X}_0 \bar{X}_1 X_3 + X_3 \bar{M} + \bar{X}_2 X_3.$$

The corresponding decoder is $$X_0 = \bar{Y}_2 \bar{Y}_4 X_3 + Y_0 Y_2 \bar{Y}_3 + Y_1$$

$$X_1 = Y_2$$

$$X_2 = Y_0 X_3 + Y_0 X_0 + Y_3 \qquad (4)$$

$$X_3 = Y_0 Y_3 + Y_4.$$

These logic rules are representative of those that could be developed for any of the MTR codes using industry standard design packages.

Block codes with short block lengths tend to have low efficiencies because many potential codewords are eliminated by the boundary conditions. State-dependent encoders can use more codewords and achieve higher efficiencies because the state carries information about the previously used codeword(s). A shortcoming of codes that use a state-dependent encoder is that, in general, they require a sliding-block decoder that examines the codeword and other codewords adjacent to it. This mechanism can cause detection errors in adjacent codewords to affect the decoding of other codewords, an effect known as error propagation. It is possible to conceive state-depended encoders that use block decoders, thereby eliminating error propagation in the decoder. To this end, a two-state encoder can be formed in which the two states correspond to the last bit of the previous codeword. Knowledge of the most recent bit allows codewords to be added for both cases. In this manner, the mapping from dataword to codeword is dependent on the previously used codeword, but if the mapping from codeword to dataword is unique, a block decoder can be used.

An application of this technique is the reduction of the k constraint for a particular block code. The block code boundary condition eliminates all codewords that begin with "11", but if the last bit is known to be a 0, these codewords are valid. For small block sizes, the k constraint usually comes into effect when codewords beginning and ending with 0 are joined. By replacing the codewords with a long run of NRZI 0's with a codeword beginning with "11" when the previous bit is a 0, the k constraint can be reduced. To illustrate this, consider the rate 4/5 MTR(2;8) code. The RLL k=8 condition exists only when the codewords 10000 and 00001 are put together. Similarly, k=7 occurs when 10000 and 00010 or 01000 and 00001 are combined. All three cases can be eliminated if, following a codeword with $Y_4=0$, the codewords 00001 and 00010 are replaced by codewords where $Y_0=1$. This is not possible for a block code because all the available codewords are used; however, codewords beginning with 110 are valid if the preceding bit is a 0. In the case of codewords with length n=5, three such words exist; they are 11000, 11001, and 11010. To reduce the required k constraint to 6, the following conditional mappings are used:

$$Y|(X = 0001) = \left\{ \begin{array}{c} 11001, Z = 0 \\ 00001, Z = 1 \end{array} \right\} \qquad (5)$$

and $$Y|(X = 0010) = \left\{ \begin{array}{c} 11000, Z = 0 \\ 00010, Z = 1 \end{array} \right. \qquad (6)$$

where Z is the value of $Y_4$ in the previous codeword. All other pairings are unchanged from Table I. In effect, the conditional mappings creates a state dependent encoder with two states. Unlike most state dependent encoders, there is only one possible data word for each codeword; therefore, a block decoder can be used. Boolean equations for the resulting encoder is given by $$Y_0 = \bar{X}_1 \bar{Y}_1 \bar{Y}_3 \bar{Y}_4 + X_2 \bar{Y}_3 + \bar{X}_0 Y_1 + X_2 X_3$$

$$Y_1 = \bar{X}_1 X_2 \bar{X}_3 \bar{Z} + \bar{X}_1 \bar{X}_2 X_3 \bar{Z} = X_0 \bar{X}_1 \bar{X}_3 + X_0 \bar{X}_2$$

$$Y_2 = X_1 \qquad (7)$$

$$Y_3 = \bar{X}_1 X_2 \bar{X}_3 Z + X_0 \bar{X}_1 X_2 + \bar{X}_0 X_1 X_2$$

$$Y_4 = X_3 \bar{Y}_3.$$

The corresponding block decoder is $$X_0 = \bar{Y}_2 Y_4 X_3 + Y_2 \bar{Y}_3 X_2 + \bar{Y}_0 Y_1$$

$$X_1 = Y_2$$

$$X_2 = Y_0 Y_1 \bar{Y}_4 + Y_0 \bar{Y}_1 Y_4 + Y_0 Y_2 + Y_3 \qquad (8)$$

$$X_3 = Y_0 Y_3 + Y_4.$$

MODIFIED DETECTION AND DISTANCE GAIN

Figure 7:
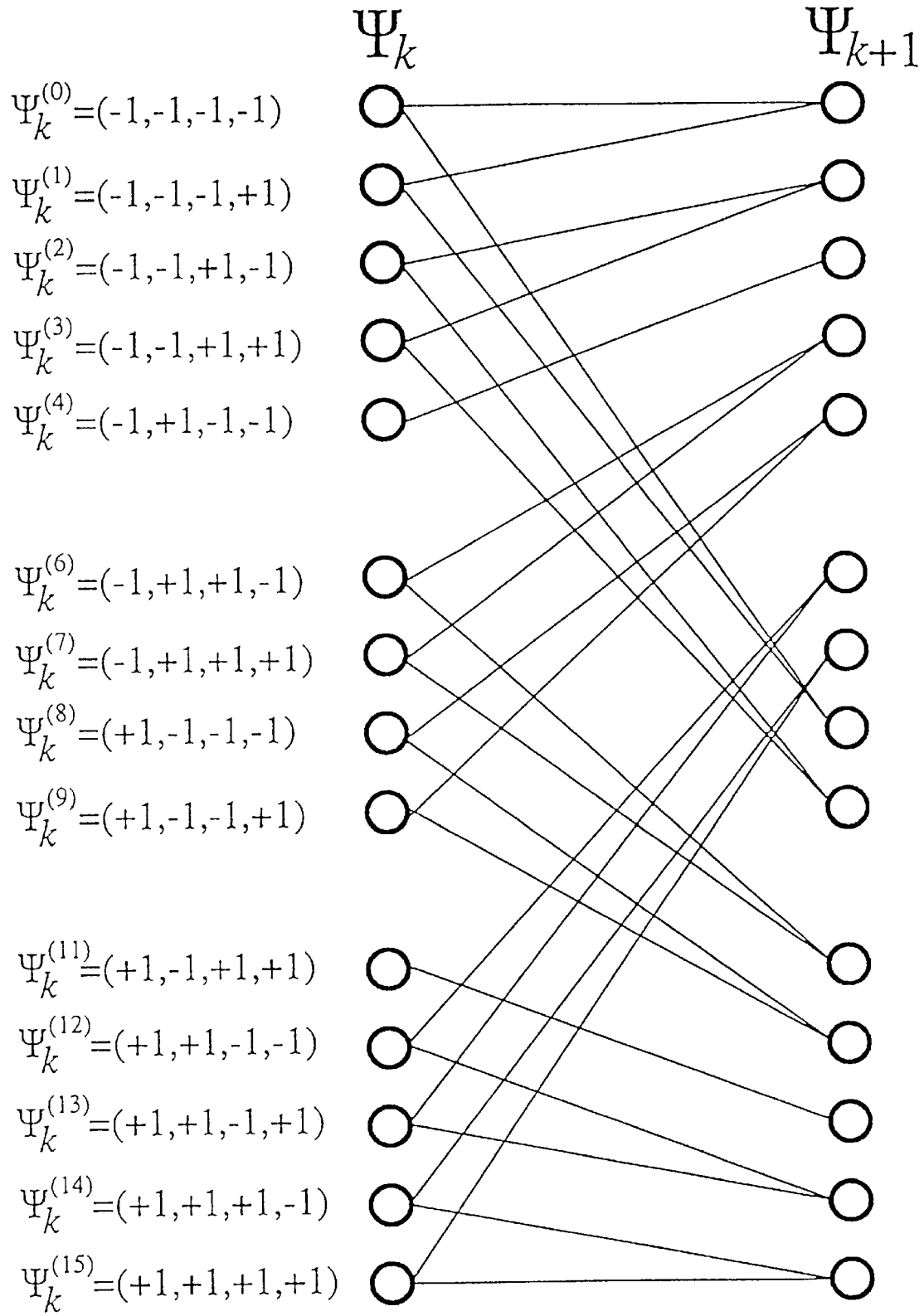
FIG. 7 is the $E^2PR4$-VA trellis modified for use with an MTR j=2 code.
Figure 8:
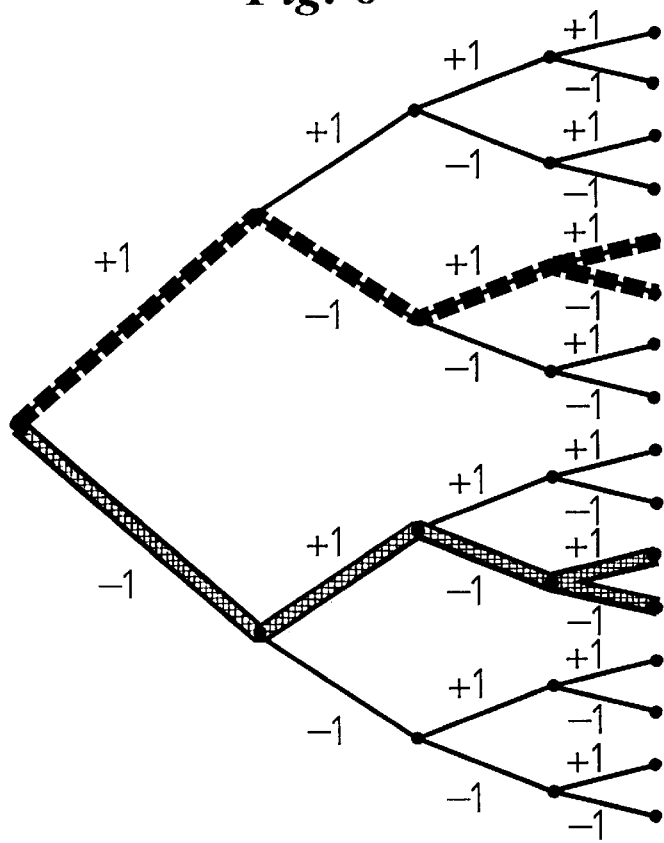
FIG. 8 illustrates a FDTS τ=3 detector modified for use with an MTR j=2 code.
Figure 9:
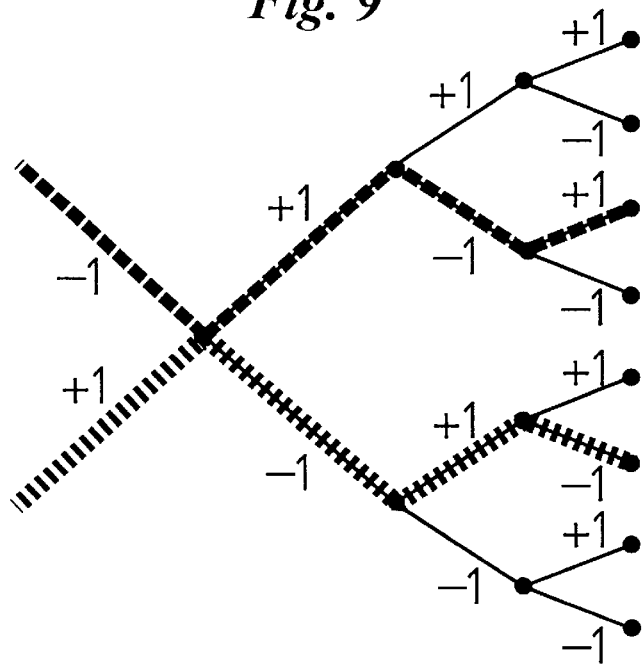
FIG. 9 illustrates a FDTS τ=2 detector modified for use with an MTR j=2 code.

To realize the coding gain at the detector output, the detector has to be modified. In the case of PRML systems, this amounts to removing those states that correspond to the illegal data patterns from a trellis. A Viterbi trellis corresponding to an $E^2PR4$ system modified for use with MTR (2;k) coding is shown in FIG. 7. For uncoded or RLL(0,k) systems, all 16 states would be present along with two state transitions corresponding to the two binary inputs. The state labels are $\Psi_k = (a_k, a_{k-1}, a_{k-2}, a_{k-3})$ where $a_k$ are the NRZ write current symbols taking on values from $\{-1,+1\}$. The states labeled 5 and 10, corresponding to $(-1,+1,-1,+1)$ and (+1,−1,+1,−1), respectively, have been removed because they represent three consecutive transitions in the NRZ data. Similar modifications can be performed on higher order PRML detectors. For the FDTS/DF detector, the code-violating look ahead paths must be prevented from being chosen as the most-likely path, a technique similar to the one used in the RLL(1,7) coded FDTS/DF channel. To illustrate the idea, consider FIG. 8 that shows a τ=3 look ahead tree utilized in FDTS/DF detection. The shaded paths in the tree correspond to the input data patterns with three consecutive transitions, and are considered illegal. For the τ=2 tree shown in FIG. 9, the past decision must be used to determine an illegal path, which is either the third path or the sixth path, as indicated by the marked paths. The complexity in the signal space formulation of the FDTS/DF detector is also reduced greatly with the MTR code. See, for example, B. Brickner and J. Moon, "A high dimensional signal space implementation of FDTS/DF," presented at Intermag '96, Seattle, Wash., April 1996. For a more detailed description of FDTS/DF detection, see U.S. Pat. No. 5,136,593.

With this modification in FDTS/DF detection, the squared minimum Euclidean distance between any two diverging paths, denoted by $\beta_{min}$, is typically given by $4(1+f_1^2+f_2^2+\ldots+f_\tau^2)$ for τ greater than or equal to 2, where $f=(1, f_1, f_2, \ldots, f_{1-1})$ represents the 1 sample equalized dibit response (at the output of the forward equalizer) normalized so the first sample is 1. The effective SNR gain of the τ=2 FDTS/DF over the DFE, assuming the MTR j=2 code, is given by 101 $og_{10}(1/1+f_1^2+f_2^2)$dB.

The distance gain with MTR coding is also significant for high order PRML systems such as E²PR4. When the critical NRZ error pattern is ±{2−2 2}, the minimum distance for the E²PR4 response {1 2 0−2−1} is 6√2. With MTR coding, the worst case error pattern becomes a single bit error pattern of ±{2}, and the corresponding channel output distance is simply the square root of the energy in the equalized dibit response, or 10√2. This increase in the minimum distance is equivalent to an SNR gain of 2.218 dB. If the code rate penalty is small, the overall coding gain is significant.

DC-FREE MTR CODES

Other useful constraints can be imposed on the MTR code at the expense of lowering the code rate. There exist storage systems where the recorded square waveform cannot have a DC component. In such applications, a DC-free constraint is necessary on the written data. The MTR code can be designed to have a DC-free property. A DC-free constraint is satisfied by bounding the running digital sum (RDS) of the binary sequence. The RDS at a given time is defined to be the excess number of 1's over 0's in the binary sequence up to that time, assuming the NRZ recording format is used (a negative RDS means there has been more 0's than 1's).

Figure 11B:
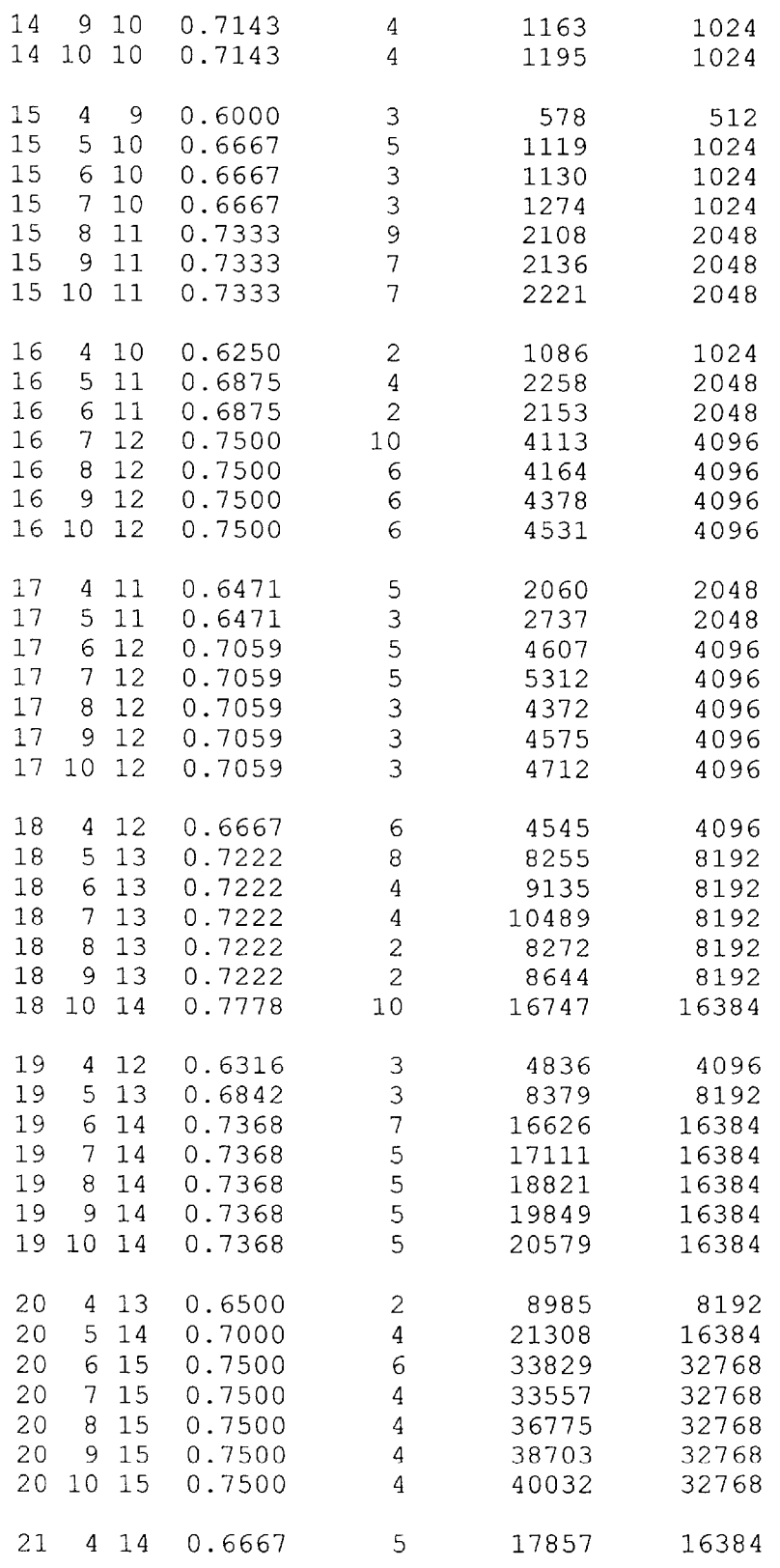
Figure 11C:
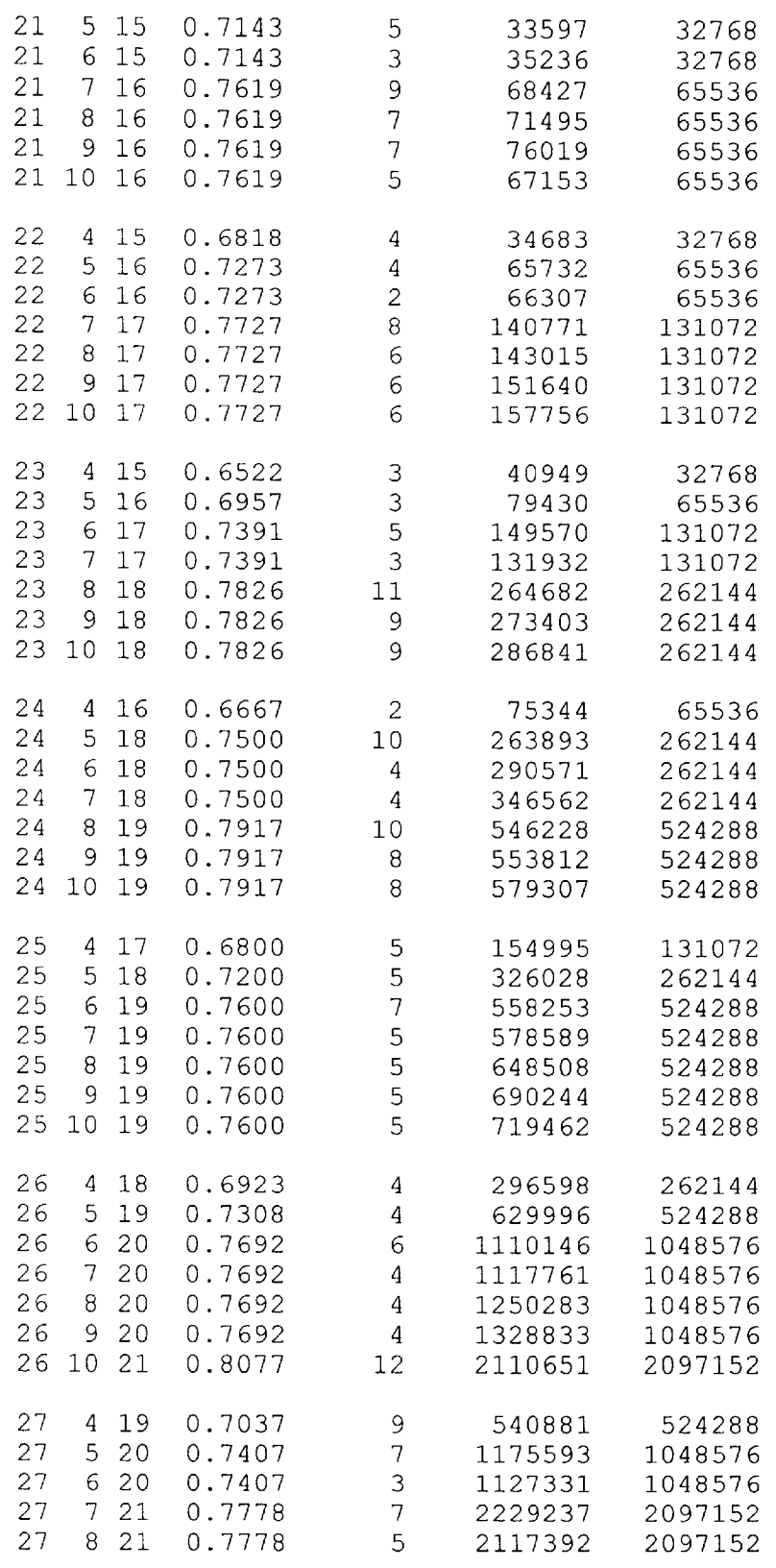

The following method can be used to design DC-free MTR codes. Assume an NRZ recording format. Starting from a list of $2^n$ n-bit binary words, first remove all binary words that contain either "0101" or "1010" as well as any words that contain more than k+1 consecutive like symbols. Then, to satisfy the MTR j=2 constraint at the codeword boundaries, remove all words that start with "01" or "10" and remove all words that end with "101" or "010". The same effect can be achieved by removing all words that end with 01 or 10 as well as the words that start with "101" or "010". The k constraint can be satisfied at boundaries by eliminating all words that either start with $k_1$ consecutive like symbols or end with $k_2$ consecutive like symbols, where $k_1$ and $k_2$ are preselected numbers such that $k_1+k_2=k+1$. The remaining codewords in the list now satisfy the MTR constraint as well as the k constraint. Investigation of the remaining codewords reveals that for every codeword, there exists another codeword which is a bit-by-bit complement of the first codeword. Now define charge C to be the number of 1's in the codeword minus the number of 0's in the same codeword. If a codeword has a charge C, its bit-wise complement will have a charge −C. This property is used to design a DC-free code. The final list of the valid DC-free MTR codewords is obtained by further removing either all the words with negative charges or all the words with positive charges. The final list now contains codewords with either zero-charge or charges with the same polarity. When a dataword is mapped to a zero-charge codeword, the mapping is one-to-one as usual. But when a dataword is mapped to non-zero-charge codeword, either the codeword itself or its bit-wise complement is released by the encoder output, depending of the RDS value at the end of the last codeword. By choosing the codeword with a polarity which is opposite to the polarity of the present RDS value, the RDS is always kept bounded. FIG. 10 shows a decimal representation of codewords corresponding to different values of C for the 8/12 DC-free MTR code. The k-constraint in this case is equal to 8. FIG. 11 lists the code parameters for various DC-free MTR block codes obtained using the method described above.

While the preferred embodiments of the invention have been shown and described, it will be obvious to those skilled in the art that changes, variations and modifications may be made therein without departing from the invention in its broader aspects and, therefore, the aim in the appended claims is to cover such changes and modifications as fall within the scope and spirit of the invention.

What is claimed is:

1. Apparatus for encoding m-bit binary datawords into n-bit binary codewords, in a recorded waveform, where m and n are preselected positive integers such that n is greater than m, comprising:

receiver means for receiving the dataword;

encoder means coupled to the receiver means, for producing sequences of fixed length codewords;

means for imposing a pair of constraints (j;k) on the encoded waveform wherein the j constraint is defined as the maximum number of consecutive transitions allowed on consecutive clock periods in the encoded waveform to facilitate the reduction of a probability of a detection error in said receiver means;

said sequences generating no more than j consecutive transitions in the recorded waveform such that j is an integer equal to or greater than 2; and said sequences generating no more than k consecutive sample periods without a transition in the recorded waveform.

2. Apparatus as in claim 1 wherein the j consecutive transition limit is defined by the relationship 2≦j<10.

3. Apparatus as in claim 2 wherein the encoder means produces a codeword, in response to each dataword sequentially, based on a predetermined word-by-word mapping of $2^m$ m-bit datawords to one of N n-bit codeword sets, wherein N may be written as $N=2^i$ and i is a positive integer and further that a selection of one of said N n-bit codeword sets is determined by a state of the encoder wherein said state is a predetermined function of a previous state and the encoder input and each set contains $2^m$ codewords wherein, a particular codeword may appear more than once in a given set and further a particular codeword may also appear in more than one set.

4. Apparatus as in claim 3 wherein the encoder means produces a codeword in response to each dataword sequentially, based on a predetermined word-by-word mapping of $2^m$ m-bit datawords to one of two n-bit codeword sets, where each particular codeword set contains $2^m$ different codewords, some of which may also be used in the other set and the set mapped to the encoder is chosen based on the last binary symbol of the previous codeword.

5. Apparatus as in claim 4 wherein, a first set (A) is chosen when a last binary symbol of a previous codeword (Z) is a 0 and a second set (B) is chosen when Z is a 1 and valid codewords for sets A and B are by the steps of:

removing binary words that contain more than one of j consecutive 1's and more than k consecutive 0's from each of two lists of $2^n$ possible codewords for sets A and B, respectively;

removing words that end with two consecutive 1's from both lists;

removing words from the list for set B that begin with two consecutive 1's;

selecting $k_1+k_2=k$;

removing words from the list for set A that begin with one of $k_1+1$ 0's and end with $k_2+1$ 0's;

removing words from the list for set B that end with consecutive 0's and $k_2+1$; and selecting the $2^m$ codewords used in each of set A and set B from the respective lists, each of which contains at least $2^m$ codewords.

6. Apparatus as in claim 2 wherein the sequences of codewords also satisfy a DC-free constraint.

7. Apparatus as in claim 6 wherein the encoder means produces a codeword in response to each dataword sequentially, based on a predetermined word-by-word mapping of $2^m$ m-bit datawords to $2^m$ n-bit codewords, where the codewords are preselected using a selection method comprising the steps of:

removing binary words that contain either "0101" or "1010" from a list of $2^n$ possible n-bit binary words;

removing words that contain more than k+1 consecutive like symbols;

removing all words that begin with "01" or "10" and those that end with "101" or "010" having an equivalent effect of removing all words that begin with "101" or "010" and all words that end with "01" or "10";

removing one and combinations thereof of words that begin with $k_1+1$ consecutive like symbols and words that end with $k_2+1$ consecutive like symbols where $k_1+k_2=k$;

forming a set (A) of codewords with the number of 1's not less than the than number of 0's;

forming a set (B) of codewords with the number of 0's not less than the than number of 1's;

selecting codewords from set A if the number of 0's in all the previous encoder outputs exceeds the number of 1's; and selecting codewords from set B if the number of 0's in all the previous encoder outputs does not exceed the number of 1's.

8. Apparatus as in claim 2 wherein the consecutive transition limit is defined by the relationship j=2.

9. Apparatus as in claim 2 wherein the binary sequences produced by combining codewords have no more than j consecutive 1's and no more than k consecutive 0's when used with a NRZI recording format.

10. Apparatus as in claim 2 wherein binary sequences produced by combining codewords have no more than one of j consecutive transitions from 0 to 1 and from 1 to 0 and no more than one of k+1 consecutive 0's and k+1 consecutive 1's when used in conjunction with a NRZ recording format.

11. Apparatus as in claim 2 wherein the encoder means produces a codeword in response to each dataword sequentially, based on a predetermined word-by-word mapping of $2^m$ m-bit datawords to $2^m$ n-bit codewords, wherein the codewords are preselected using a selection method comprising the steps of:

removing binary words that contain more than one of j consecutive 1's and more than k consecutive 0's from a list of $2^n$ possible n-bit binary words;

removing one of binary words that begin and end with two consecutive 1's;

removing one of binary words that begin with $k_1+1$ consecutive 0's and end with $k_2+1$ consecutive 0's where $k_1+k_2=k$; and choosing $2^m$ codewords remaining in the list, which contains at least $2^m$ valid codewords.

12. Apparatus as in claim 2 wherein the receiver means incorporates means for removing certain code-violating patterns from the detection process wherein the detection process comprises at least one of the steps of:

removing states and state transitions corresponding to more than j consecutive transitions from a Viterbi trellis;

removing branches from a fixed delay tree search corresponding to more than j consecutive transitions;

removing branches from a fixed delay tree search corresponding to more than j consecutive transitions when the previous decision is considered part of the sequence;

forming boundaries for a signal space formulation such that points in the signal space constellation corresponding to sequences containing more than j consecutive transitions are not considered; and selecting boundaries in a signal space formulation based on a constellation that does not include points corresponding to sequences containing more than j consecutive transitions when the previous decision is considered part of the sequence.

13. A method for encoding m-bit binary datawords into n-bit binary codewords in a recorded waveform, where m and n are preselected positive integers such that n is greater than m, comprising the steps of:

receiving binary datawords; and producing sequences of n-bit codewords;

imposing a pair of constraints (j;k) on the encoded waveform;

generating no more than j consecutive transitions of said sequence in the recorded waveform such that $j \geq 2$; and generating no more than k consecutive sample periods of said sequences without a transition in the recorded waveform.

14. The method as in claim 13 wherein the consecutive transition limit is defined by the equation $2 \leq j < 10$.

15. The method as in claim 14 wherein the consecutive transition limit is j=2.

16. The method as in claim 14 wherein the binary sequences produced by combining codewords have no more than j consecutive 1's and no more than k consecutive 0's when used with the NRZI recording format.

17. The method as in claim 14 wherein the binary sequences produced by combining codewords have no more than one of j consecutive transitions from 0 to 1 and from 1 to 0 and no more than one of k+1 consecutive 0's and k+1 consecutive 1's when used in conjunction with the NRZ recording format.

18. The method as in claim 14 wherein the encoder means produces a codeword in response to each dataword sequentially, based on a predetermined word-by-word mapping of $2^m$ m-bit datawords to $2^m$ n-bit codewords, where the codewords are preselected using a selection method comprising the steps of:

removing binary words that contain more than j consecutive 1's and words that contain more than k consecutive 0's from a list of $2^n$ possible n-bit binary words;

removing one of binary words that begin and end with two consecutive 1's;

removing one of words that begin with $k_1+1$ consecutive 0's and end with $k_2+1$ consecutive 0's where $k_1+k_2=k$;

choosing $2^m$ codewords from the remaining list, which contains at least $2^m$ valid codewords.

19. The method as in claim 14 wherein the encoder means produces a codeword in response to each dataword sequentially, based on a predetermined word-by-word mapping of $2^m$ m-bit datawords to one of N n-bit codeword sets, wherein N may be written as $N=2^i$ where i is a positive integer and the selection of one of N codeword sets is determined by the state of the encoder and said state is a predetermined function of the previous state and encoder input and that each set contains $2^m$ codewords and further that a particular codeword may appear more than once in a given sets and may also appear in more than one set.

20. The method as in claim 14 wherein the sequences of codewords also satisfy a DC-free constraint.

21. The method as in claim 13 wherein the method of receiving data incorporates the removal of certain code-violating patterns from the detection process wherein the detection process comprises at least one of the steps of:

removing states and state transitions corresponding to more than j consecutive transitions from a Viterbi trellis;

removing branches from a fixed delay tree search corresponding to more than j consecutive transitions;

removing branches from a fixed delay tree search corresponding to more than j consecutive transitions when the previous decision is considered part of the sequence;

forming boundaries for a signal space formulation such that points in the signal space constellation corresponding to sequences containing more than j consecutive transitions are not considered; and selecting boundaries in a signal space formulation based on a constellation that does not include points corresponding to sequences containing more than j consecutive transitions when the previous decision is considered part of the sequence.

* * * * *